(12) United States Patent
Yoshikawa et al.

(10) Patent No.: US 9,595,663 B2
(45) Date of Patent: Mar. 14, 2017

(54) MAGNETIC MEMORY HAVING MAGNETORESISTIVE ELEMENT AND METHOD OF MANUFACTURING MAGNETORESISTIVE ELEMENT

(71) Applicants: Masatoshi Yoshikawa, Seoul (KR); Yasuyuki Sonoda, Seoul (KR); Satoshi Seto, Seoul (KR); Shuichi Tsubata, Seoul (KR); Kazuhiro Tomioka, Seoul (KR)

(72) Inventors: Masatoshi Yoshikawa, Seoul (KR); Yasuyuki Sonoda, Seoul (KR); Satoshi Seto, Seoul (KR); Shuichi Tsubata, Seoul (KR); Kazuhiro Tomioka, Seoul (KR)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 27 days.

(21) Appl. No.: 14/479,180

(22) Filed: Sep. 5, 2014

(65) Prior Publication Data
US 2015/0263273 A1    Sep. 17, 2015

Related U.S. Application Data

(60) Provisional application No. 61/952,044, filed on Mar. 12, 2014.

(51) Int. Cl.
*H01L 43/12* (2006.01)
*H01L 27/22* (2006.01)
(Continued)

(52) U.S. Cl.
CPC ............ *H01L 43/12* (2013.01); *H01L 27/228* (2013.01); *H01L 43/08* (2013.01); *H01L 43/02* (2013.01)

(58) Field of Classification Search
USPC ................................................ 257/295; 438/3
See application file for complete search history.

(56) References Cited

U.S. PATENT DOCUMENTS 6,256,223 B1    7/2001  Sun
2004/0075125 A1*  4/2004  Asao ...................... B82Y 10/00
                                          257/295
(Continued)

FOREIGN PATENT DOCUMENTS

JP        2013201343 A    10/2013

OTHER PUBLICATIONS

U.S. Appl. No. 14/456,883, filed Aug. 11, 2014, First Named Inventor: Kazuhiro Tomioka, Title: "Manufacturing Method of Magnetic Memory Device and Manufacturing Apparatus of Magnetic Memory Device".

(Continued)

*Primary Examiner* — Hrayr A Sayadian
(74) *Attorney, Agent, or Firm* — Holtz, Holtz & Volek PC

(57) ABSTRACT

According to one embodiment, a magnetic memory includes a transistor having first and second diffusion layers in a semiconductor substrate and a gate electrode between the first and second diffusion layers, a first insulating layer on the semiconductor substrate, the first insulating layer covering the transistor, a first contact plug in the first insulating layer, the first contact plug connected to the first diffusion layer, a second contact plug in the first insulating layer, the second contact plug connected to the second diffusion layer, a magnetoresistive element on the first insulating layer, the magnetoresistive element connected to the first contact plug, an electrode on the magnetoresistive element, and an impurity region in the first insulating layer, the second contact plug, and the electrode.

5 Claims, 14 Drawing Sheets

(51) Int. Cl.
*H01L 43/08* (2006.01)
*H01L 43/02* (2006.01)

(56) References Cited

U.S. PATENT DOCUMENTS

2013/0001652 A1 1/2013 Yoshikawa et al.
2013/0316536 A1 11/2013 Seto et al.

OTHER PUBLICATIONS

U.S. Appl. No. 14/481,817, filed Sep. 9, 2014, First Named Inventor: Kazuhiro Tomioka, Title: "Manufacturing Method of Magnetic Memory Device and Manufacturing Apparatus of Magnetic Memory Device".
U.S. Appl. No. 14/479,192, filed Sep. 5, 2014, First Named Inventor: Masatoshi Yoshikawa, Title: "Magnetic Memory Device".

\* cited by examiner

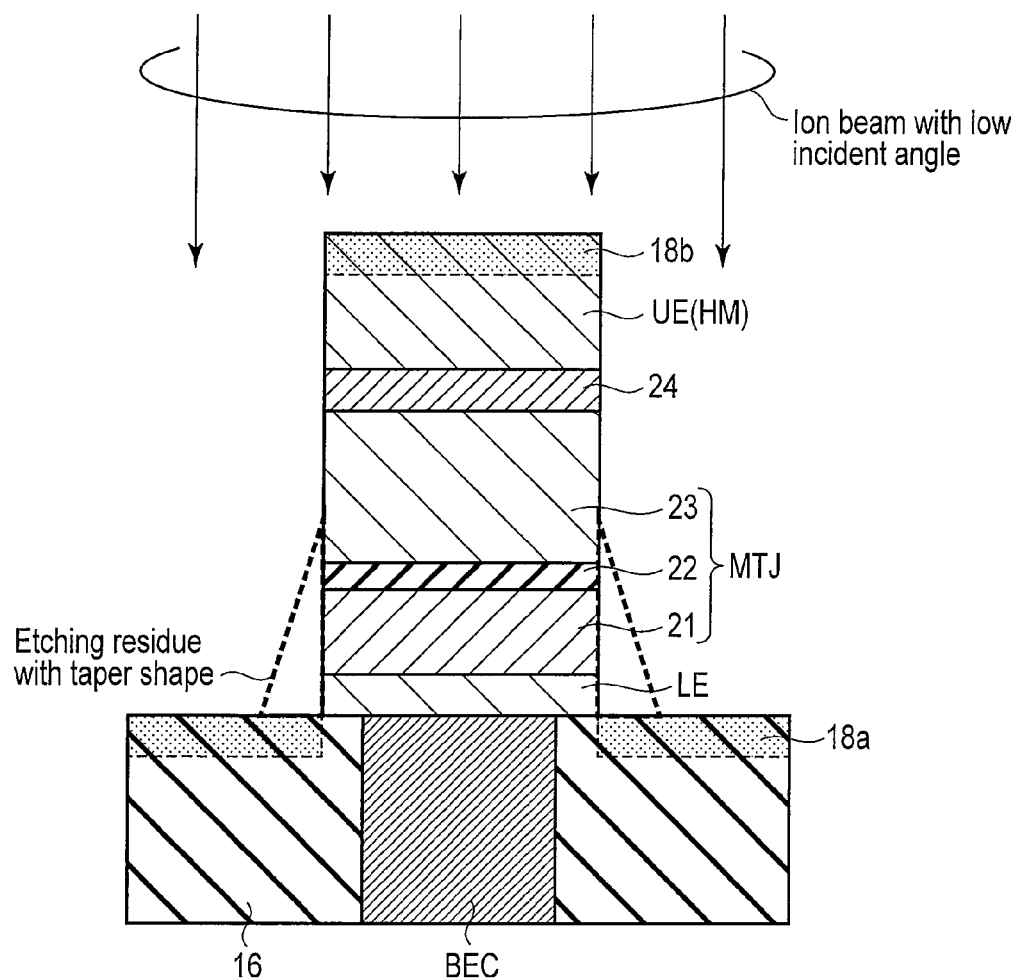
F I G. 9

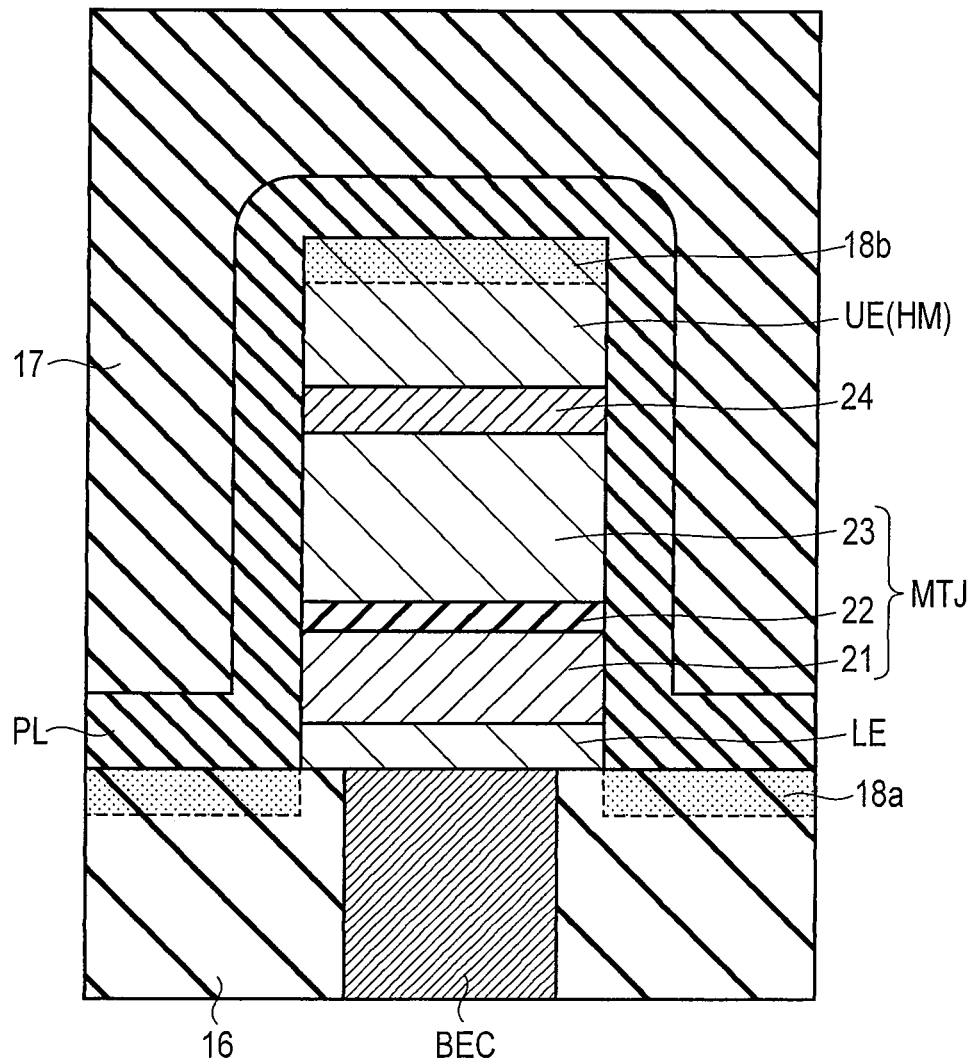
F I G. 10

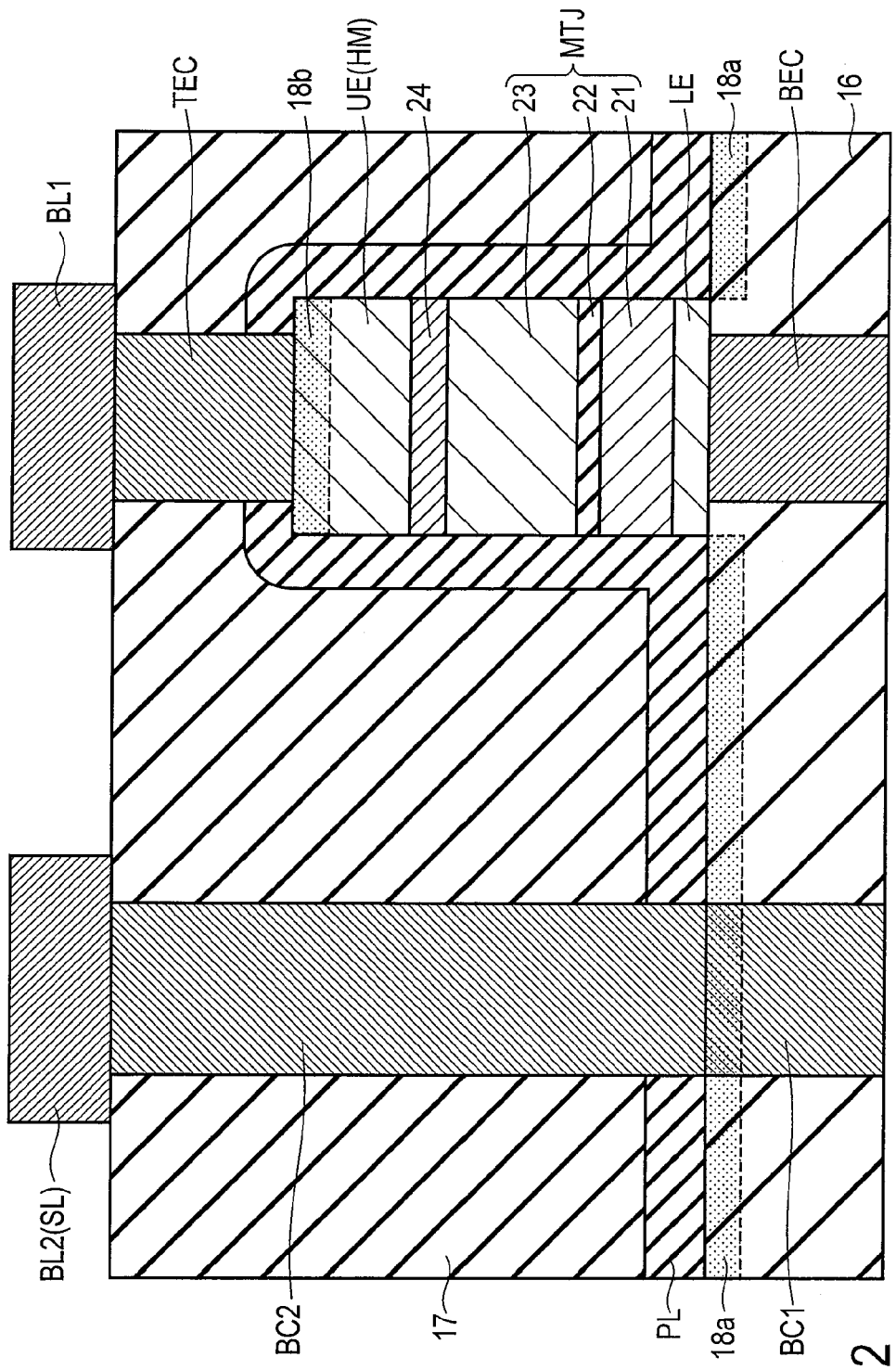
F I G. 12

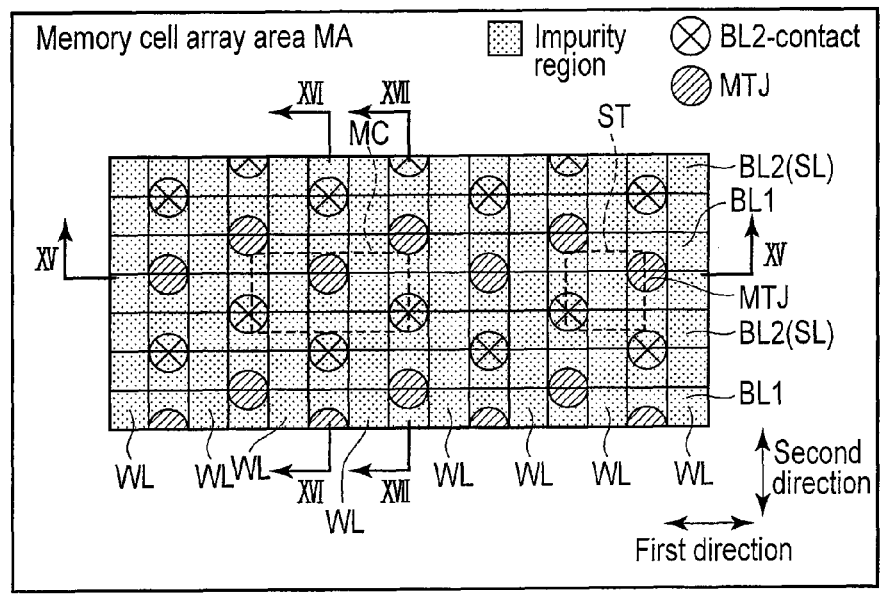
F I G. 14
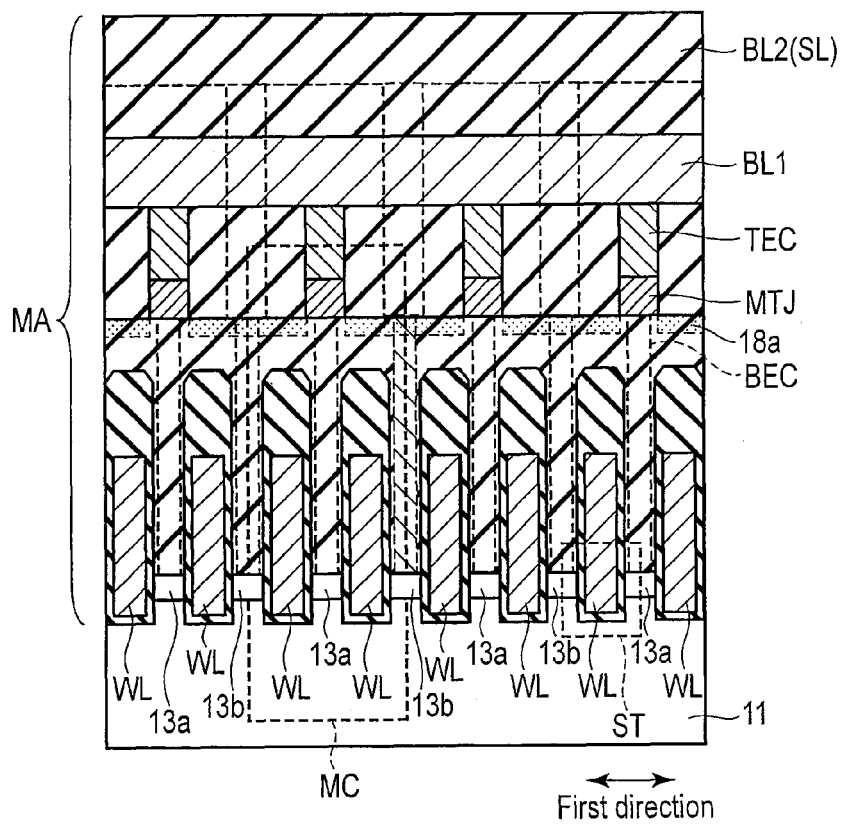
F I G. 15

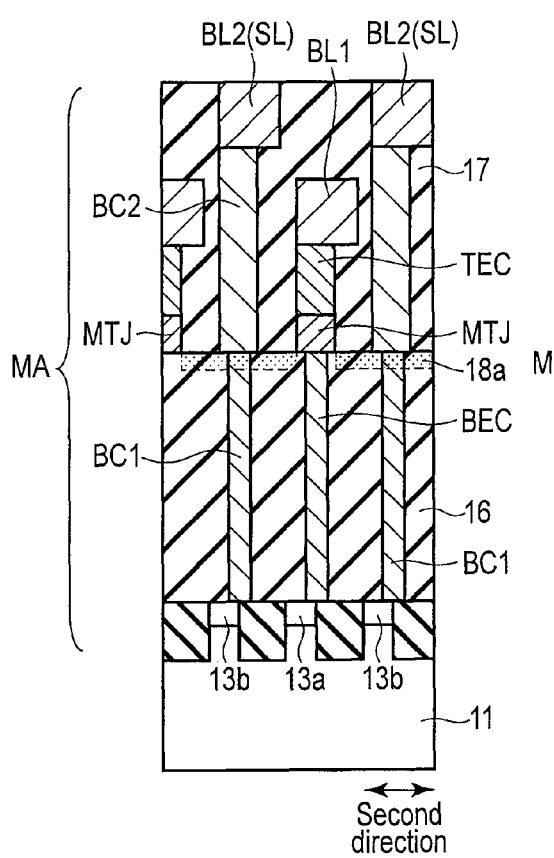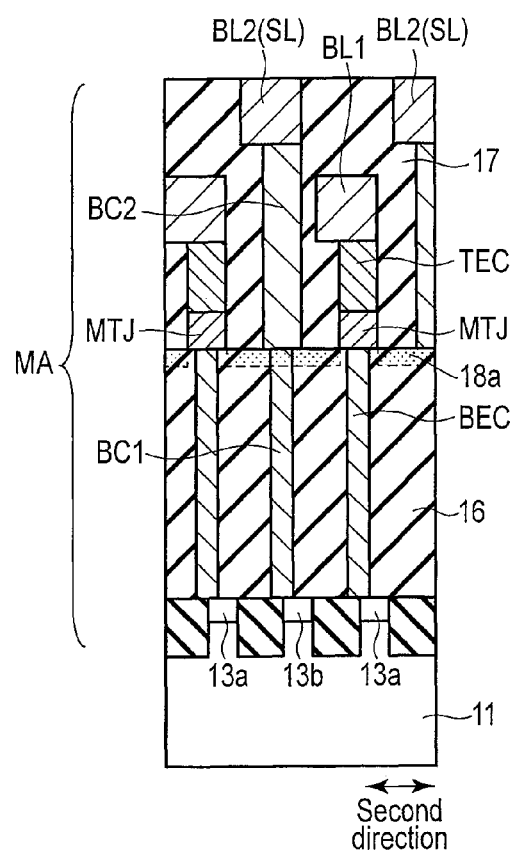
F I G. 16        F I G. 17

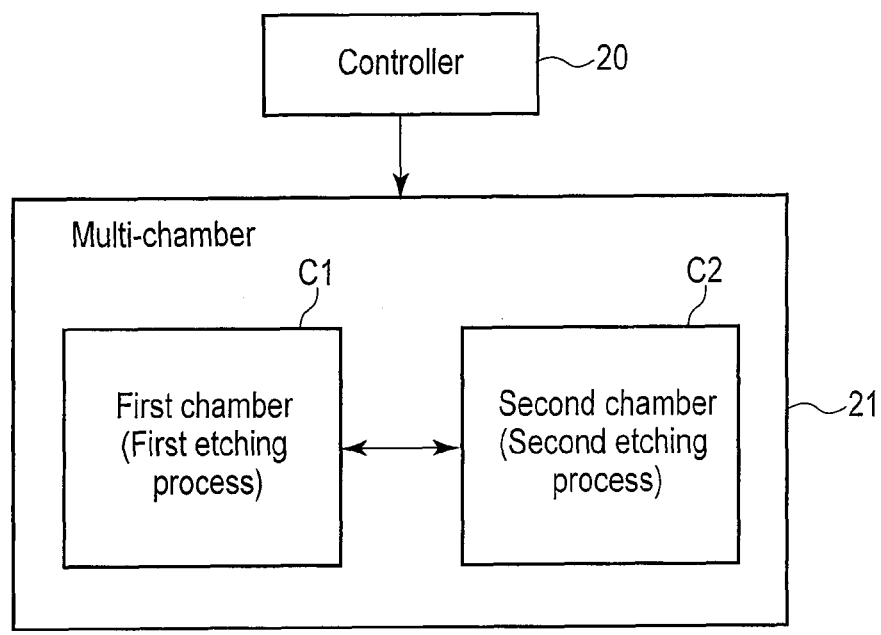
F I G. 19
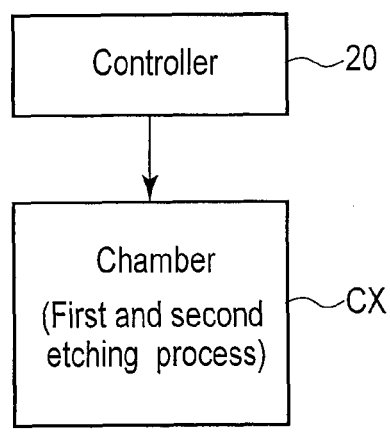
F I G. 20

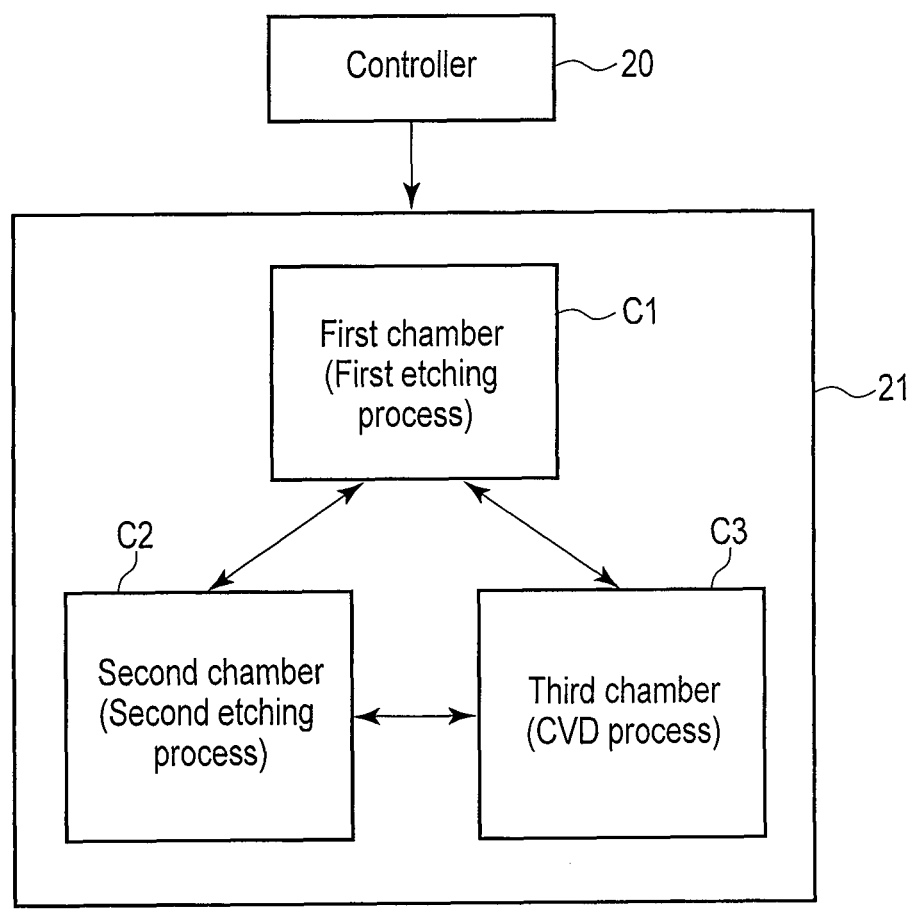
F I G. 21

MAGNETIC MEMORY HAVING MAGNETORESISTIVE ELEMENT AND METHOD OF MANUFACTURING MAGNETORESISTIVE ELEMENT

CROSS-REFERENCE TO RELATED APPLICATIONS

This application claims the benefit of U.S. Provisional Application No. 61/952,044, filed Mar. 12, 2014, the entire contents of which are incorporated herein by reference.

FIELD

Embodiments described herein relate generally to a magnetic memory having a magnetoresistive element and a method of manufacturing a magnetoresistive element.

BACKGROUND

In a spin-injection-writing magnetic memory such as a spin-transfer-torque magnetic random access memory (STT-MRAM), current required for magnetization inversion of a magnetoresistive element is defined by current density. That is, the magnetic memory has such a scalability that the current required for magnetization inversion decreases in accordance with reduction in size of the magnetoresistive element. Furthermore, given that a direction of magnetization of residual magnetization of the magnetoresistive element is of a perpendicular magnetization type which is perpendicular to a film surface of the element, the current required for magnetization inversion can be reduced more. For these reasons, the spin-injection-writing magnetic memory is one of the strong candidates for a next-generation memory.

BRIEF DESCRIPTION OF THE DRAWINGS

FIGS. 6 to 12 are cross-sectional views showing examples of manufacturing methods of the magnetoresistive element.

FIG. 14 is a plane view showing a magnetic memory as an applicable example.

FIG. 15 is a cross-sectional view taken along line XV-XV in FIG. 14.

FIG. 16 is a cross-sectional view taken along line XVI-XVI in FIG. 14.

FIG. 17 is a cross-sectional view taken along line XVII-XVII in FIG. 14.

FIGS. 19 to 21 are block figures showing examples of manufacturing apparatuses.

DETAILED DESCRIPTION

In general, according to one embodiment, a magnetic memory comprises: a semiconductor substrate; a transistor having first and second diffusion layers in the semiconductor substrate and a gate electrode between the first and second diffusion layers; a first insulating layer on the semiconductor substrate, the first insulating layer covering the transistor; a first contact plug in the first insulating layer, the first contact plug connected to the first diffusion layer; a second contact plug in the first insulating layer, the second contact plug connected to the second diffusion layer; a magnetoresistive element on the first insulating layer, the magnetoresistive element connected to the first contact plug; an electrode on the magnetoresistive element; an impurity region in the first insulating layer, the second contact plug, and the electrode; a second insulating layer on the first insulating layer, the second insulating layer covering the magnetoresistive element and the electrode; a third contact plug in the second insulating layer, the third contact plug connected to the electrode; a fourth contact plug in the second insulating layer, the fourth contact plug connected to the second contact plug; a first conductive line on the second insulating layer, the first conductive line connected to the third contact plug; and a second conductive line on the second insulating layer, the second conductive line connected to the fourth contact plug.

1. Magnetic Memory Having Magnetoresistive Element

Figures 1, 2, 3:
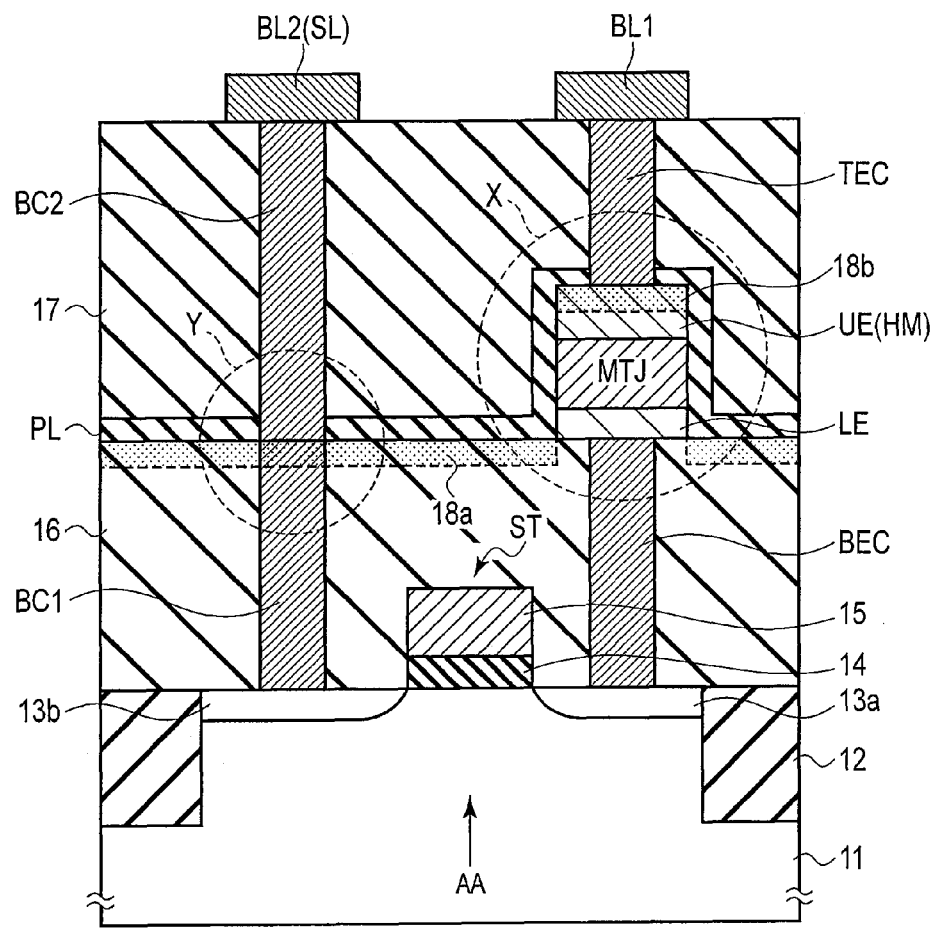
FIG. 1 shows an example of a memory cell of a magnetic memory.
FIGS. 2 and 3 are cross-sectional views showing examples of modified region X shown in FIG. 1.

FIG. 1 shows an example of a memory cell of a magnetic memory.

In the present embodiment, the memory cell of the magnetic memory includes a selection transistor (for example, an FET) ST and a magnetoresistive element MTJ.

The selection transistor ST is disposed inside an active area AA in a semiconductor substrate 11. The active area AA is surrounded by an element isolation insulating layer 12 in the semiconductor substrate 11. In the present embodiment, the element isolation insulating layer 12 is formed in a shallow trench isolation (STI) structure.

The selection transistor ST includes source/drain diffusion layers 13a and 13b in the semiconductor substrate 11, gate insulating layer 14 on a channel between these layers, and gate electrode 15 on the gate insulating layer 14. The gate electrode 15 functions as a word line.

An interlayer insulating layer (for example, a silicon oxide layer) 16 covers the selection transistor ST. Contact plugs BEC and BC1 are disposed in the interlayer insulating layer 16. The upper surface of the interlayer insulating layer 16 is flat, and a lower electrode LE is disposed on the interlayer insulating layer 16. The lower electrode LE is connected to source/drain diffusion layer 13a of the selection transistor ST through a contact plug (bottom electrode contact) BEC. Contact plug BC1 is connected to source/drain diffusion layer 13b of the selection transistor ST.

The magnetoresistive element MTJ is disposed on the lower electrode LE. Furthermore, an upper electrode UE is disposed on the magnetoresistive element MTJ. The upper electrode UE functions as, for example, a hard mask layer HM used in processing the magnetoresistive element MTJ.

An impurity region 18a is formed in the interlayer insulating layer 16 and contact plug BC1, and an impurity region 18b is formed in the upper electrode UE. The impurity regions 18a and 18b contain any one of the following elements of Ne, Ar, Kr, Xe, N, and O, for example. These elements are impurities used for ion beam etching (IBE) for patterning the magnetoresistive element MTJ.

As will be described in detail in the section of the manufacturing method, the impurities used as an ion beam for the IBE are, generally, not implanted in the interlayer insulating layer 16, contact plug BC1, or upper electrode UE. That is because the acceleration voltage of the ion beam in the IBE is less than 1 keV for the purpose of etching. In that case, an ion implantation part formed by the ion beam is shallow, and the ion implantation and the etching are performed at the same time, and eventually, the ion implantation becomes superior. That is, an impurity region is not formed. As can be understood from the above, the ion beam of the IBE generally produces a very little ion implantation effect.

However, in the present embodiment, the object is to form a magnetoresistive element in an ideal shape which has no tailing while suppressing an electrically short failure due to re-deposition and damage due to the IBE; and to achieve this object, an etching process using both a low acceleration voltage of less than 1 keV and a high acceleration voltage of 1 keV or more is suggested.

In the IBE process using a high acceleration voltage, the etching effect is reduced if the ion beam angle is small. That is, since the ion beam angle is small with respect to the interlayer insulating layer 16, contact plug BC1, and upper electrode UE, the ion implantation effect becomes superior. Thereby, impurity regions 18a and 18b are formed in the interlayer insulating layer 16 and contact plug BC1, and in the upper electrode UE, respectively.

When the acceleration voltage of the IBE is, for example, 1 keV or more, each of the impurity regions 18a and 18b has a thickness of 1 nm or more on the upper surface of the interlayer insulating layer 16, contact plug BC1, and upper electrode UE. Here, it is desired that the thickness of the impurity region 18b be thinner than the thickness of the upper electrode UE. That is, it is desired that the impurity region 18b is provided above the upper electrode UE. This is for the sake of preventing the impurity region 18b entering the magnetoresistive element MTJ.

Here, the impurity region 18a is implanted in the interlayer insulating layer 16 using the upper electrode UE as a mask, and thus, is not provided immediately below the magnetoresistive element MTJ.

A protective layer (such as silicon nitride layer) PL covers sidewalls of the magnetoresistive effect element MTJ.

An interlayer insulating layer (for example, silicon oxide layer) 17 is disposed on the protective layer PL and covers the magnetoresistive element MTJ. The upper surface of the interlayer insulating layer 17 is flat and bit lines BL1 and BL2 are disposed on the interlayer insulating layer 17. Bit line BL1 is connected to the impurity region 18b in the upper electrode UE through a contact plug (top electrode contact) TEC. Bit line BL2 is connected to the impurity region 18a in contact plug BC1 through a contact plug BC2.

As described above, in the memory cell of the present embodiment, the impurity regions 18a and 18b used for the ion beam of the IBE are formed in the interlayer insulating layer 16 and contact plug BC1, and in the upper electrode UE, respectively.

In the present embodiment, the size of the magnetoresistive element MTJ is greater than that of the contact plug TEC in a direction parallel to the surface of the semiconductor substrate 11.

However, the size of the magnetoresistive effect element MTJ is not limited thereto, and as shown in FIG. 2, the size may be equal to that of the contact plug TEC in the direction parallel to the surface of the semiconductor substrate 11, for example. Furthermore, as shown in FIG. 3, the size may be less than that of the contact plug TEC in the direction parallel to the surface of the semiconductor substrate 11.

Figure 4:
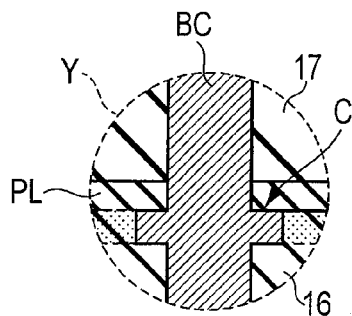
FIG. 4 is a cross-sectional view showing an example of modified region Y shown in FIG. 1.

Moreover, as shown in FIG. 4, an integrated contact plug BC may be formed in the interlayer insulating layers 16 and 17. Such an integrated structure can be obtained when the contact hole beginning from the upper surface of the interlayer insulating layer 17 and reaching source/drain diffusion layer 13b is formed in one step. In that case, the impurity region 18a in the interlayer insulating layer 16 may be etched in a lateral direction parallel to the surface of the semiconductor substrate 11. That is, the contact plug BC may have a convex portion C at a part surrounded by the impurity region 18a.

Here, a region X in each of FIGS. 2 and 3 corresponds to a region X in FIG. 1. Furthermore, a region Y in FIG. 4 corresponds to a region Y in FIG. 1.

2. Magnetoresistive Element

Figure 5:
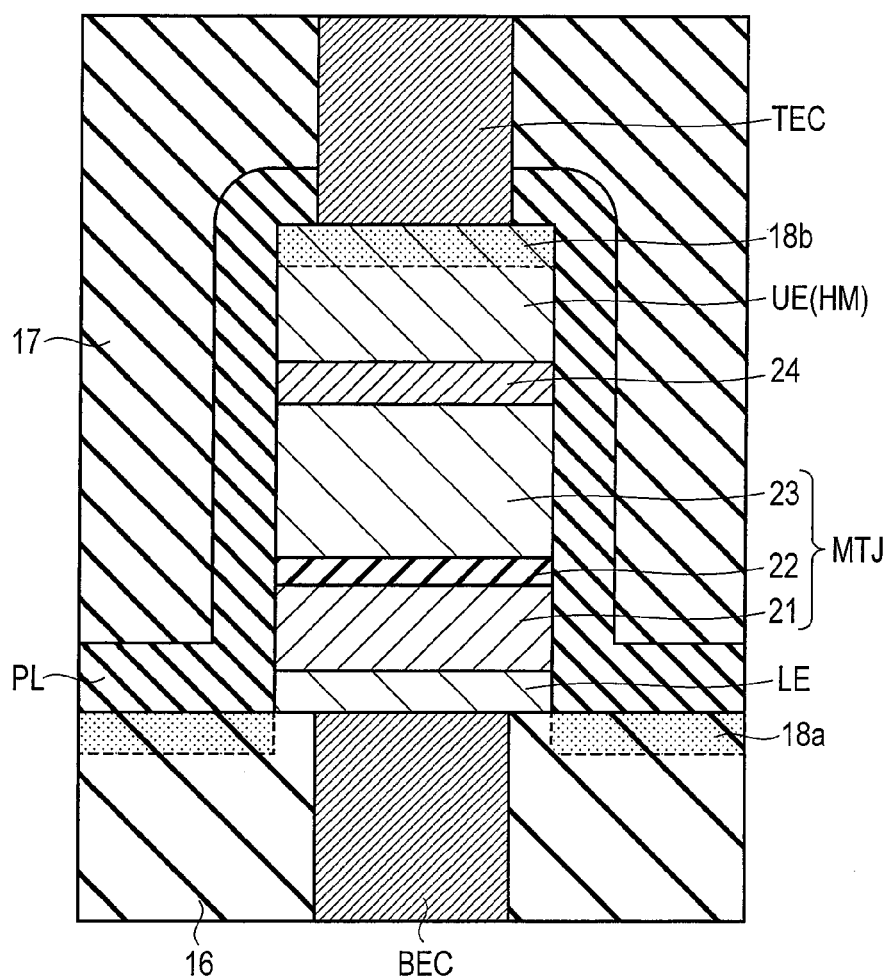
FIG. 5 is a cross-sectional view showing an example of a magnetoresistive element.

FIG. 5 shows an example of the magnetoresistive element.

Elements those have been referred to in the description related to the magnetic memory of FIG. 1 are referred to the same in the description related to FIG. 5.

The magnetoresistive element MTJ includes two ferromagnetic layers 21 and 23 and a tunnel barrier layer 22 therebetween. A cap layer 24 is inserted between the ferromagnetic layer 23 and the upper electrode UE.

One of the two ferromagnetic layers 21 and 23 is a reference layer having invariable magnetization and the other is a storage layer having variable magnetization. The direction of magnetization of residual magnetization of the two ferromagnetic layers 21 and 23 may be orthogonal to their film surfaces or may be parallel to their film surfaces.

Here, the invariable magnetization means that the direction of magnetization does not vary before or after the writing and the variable magnetization means that the direction of magnetization may be reversed before or after the writing.

Writing refers to spin transfer writing which applies spin torque to the magnetization of the storage layer by feeding spin-injection current (spin-polarized electrons) to the magnetoresistive element MTJ.

For example, when the spin-injection current flows from the storage layer to the reference layer, the electrons spin-polarized in the same direction as that of the magnetization of the reference layer are injected into the storage layer, and the spin torque is applied to the magnetization inside the storage layer. Thus, the direction of the magnetization of the storage layer becomes the same as that of the reference layer (attains a parallel state).

Furthermore, when the spin-injection current flows from the reference layer to the storage layer, among the electrons flowing from the storage layer to the reference layer, the electrons spin-polarized in the opposite direction to that of the magnetization of the reference layer are pulled back in the storage layer, and the spin torque is applied to the magnetization inside the storage layer. Thus, the direction of the magnetization of the storage layer becomes opposite to that of the reference layer (attains an anti-parallel state).

The resistance of the magnetoresistive element MTJ varies depending on the relative direction of the magnetization between the reference layer and the storage layer due to the magnetoresistive effect. That is, the resistance of the magnetoresistive element MTJ becomes low in the parallel state and becomes high in the anti-parallel state. When the resistance in the parallel state is R0 and the resistance in the anti-parallel state is R1, the value (R1-R0)/R0 is referred to as the magnetoresistive (MR) ratio.

Here, the lower electrode contains, for example, W, Ta, TaN, Ti, and TiN. The ferromagnetic layers 21 and 23 contain, for example, CoFeB, and the tunnel barrier layer 22 contains, for example, MgO. An underlayer for underlying the ferromagnetic layer 21 may be inserted between the lower electrode LE and the ferromagnetic layer 21. The underlayer contains, for example, Hf, AlN, and TaAlN. The cap layer 24 contains, for example, Pt, W, Ta, and Ru. The upper electrode UE contains, for example, W, Ta, TaN, Ti, and TiN.

When, for example, the ferromagnetic layer 21 is a storage layer and the ferromagnetic layer 23 is a reference layer, a shift cancellation layer having invariable magnetization may be inserted between the ferromagnetic layer 23 and the cap layer 24 in order to cancel a shift in magnetization inversion characteristics (hysteresis curve) of the storage layer due to a stray magnetic field from the reference layer. The shift cancellation layer contains, for example, CoPt, CoMn, and CoPd.

3. Method of Manufacturing Magnetoresistive Element

Now, a manufacturing method of the magnetoresistive element shown in FIG. 5 is described.

Figure 6:
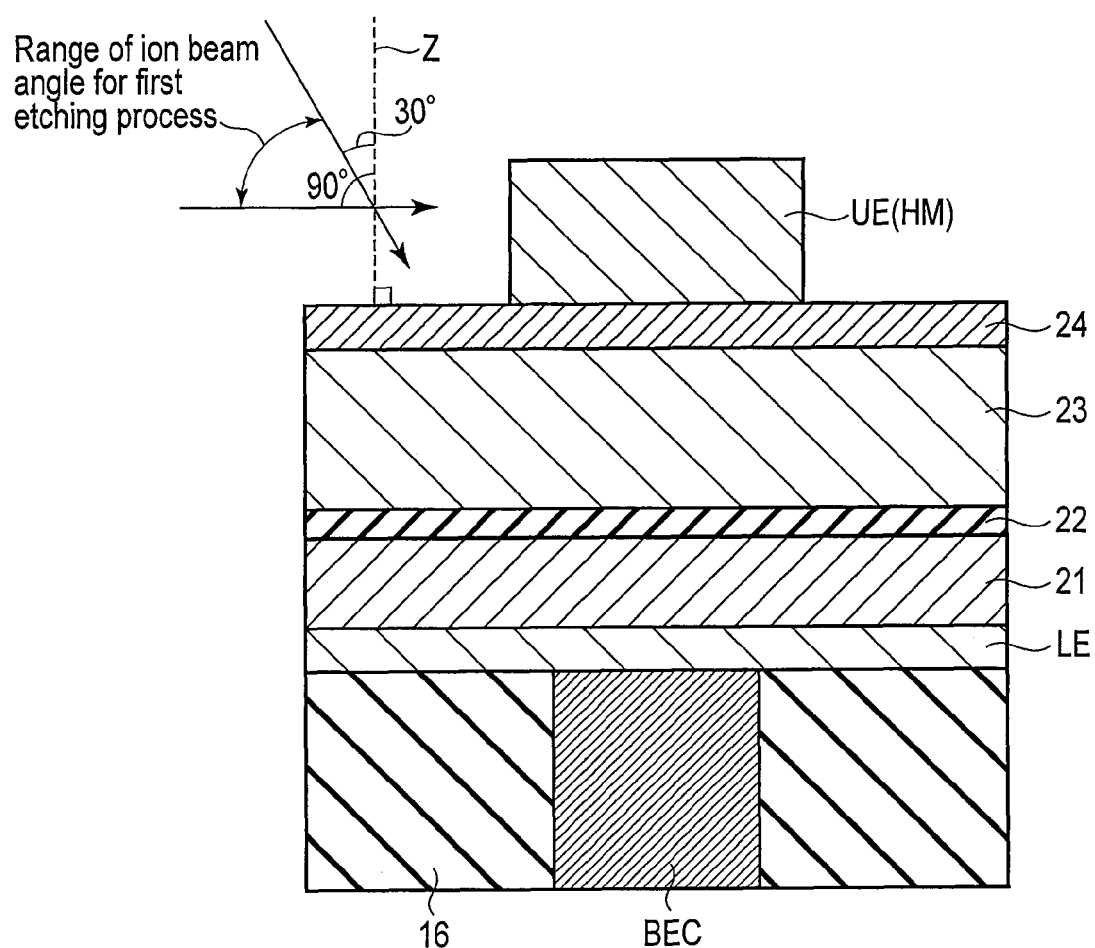

As shown in FIG. 6, formed initially is a layered structure in which the lower electrode LE, ferromagnetic layer 21, tunnel barrier layer 22, ferromagnetic layer 23, and cap layer 24 are formed on the interlayer insulating layer 16 and the contact plug TEC. Furthermore, the upper electrode UE used as the hard mask layer HM is formed on the cap layer 24.

Figure 7:
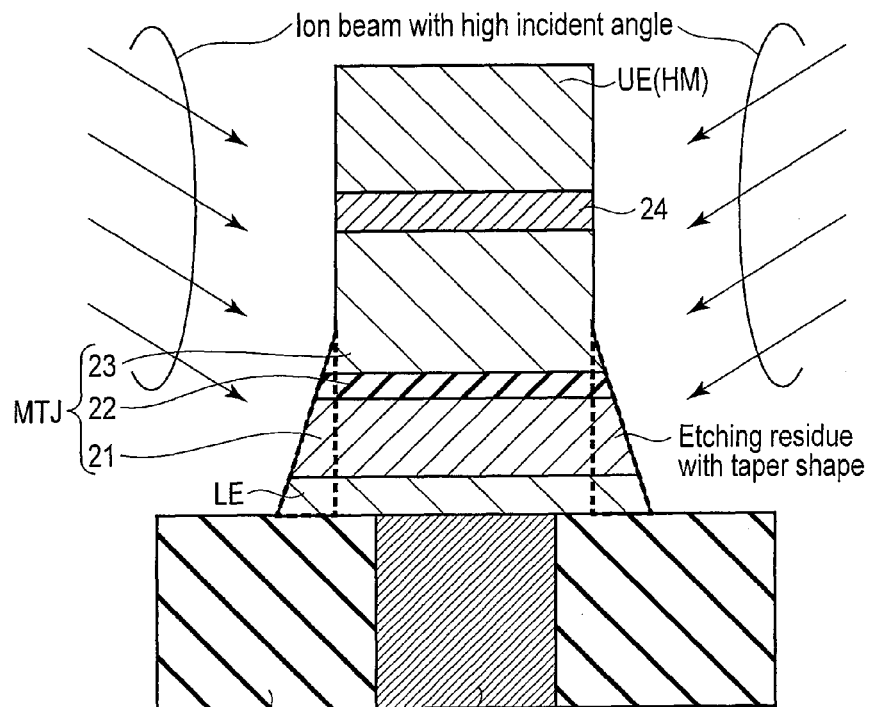

However, since the first etching process is the IBE of the large incident angle θ1, a so-called shadow effect occurs as shown in FIG. 7, and thereby, an etching residue in a tapered shape is formed at the tail portion of the magnetoresistive element MTJ.

As can be understood from the above, the ion beam angle of the IBE influences the etching selectivity between the upper electrode UE and the magnetoresistive element MTJ, the etching selectivity between the magnetoresistive element MTJ and the interlayer insulating layer 16, and the shape and amount of the etching residue.

Therefore, during the first etching process, that is, during the irradiation of the ion beam, the ion beam angle may be varied in order to set the etching selectivity large and the etching residue small. For example, by gradually decreasing the ion beam angle, the etching residue at the tail portion of the magnetoresistive element MTJ can be reduced. In addition, the ion beam angle can be made constant during the irradiation of the ion beam.

Note that the ion beam angle in the first etching process should be, as described above, in the range between 30° or more and less than 90°. However, considering good etching selectivity, good shape of the etching residue, stable etching

TABLE 1

| | Object | Method | Example | Other |
|---|---|---|---|---|
| First etching process | Patterning without re-deposition and damage High etching selectivity | Low acceleration voltage V1 V1 < 1 keV Large incident angle θ1 30° ≤ θ1 < 90° | Step which decreases angle θ1 gradually Step using constant angle θ1 | Production of etching residue |
| Second etching process | Removal of etching residue Removal without re-deposition and damage High etching selectivity | High acceleration voltage V2 V2 ≥ 1 keV Small incident angle θ2 0° ≤ θ2 < 30° | Step which decreases angle θ2 gradually Step using constant angle θ2 | Creation of ideal form |

Then, a first etching process is performed.

As can be understood from Table 1, the first etching process is performed for the purpose of patterning the magnetoresistive element without a re-deposition on the sidewalls of the tunnel barrier layer and without damage to the ferromagnetic layers 21 and 23, and for the purpose of patterning the magnetoresistive element with high etching selectivity.

Therefore, the ion beam etching (IBE) in the first etching process is performed with a low acceleration voltage V1 which is less than 1 keV and an ion beam angle (large incident angle) θ1 which is 30° or more and less than 90°.

Here, as shown in FIG. 6, the ion beam angle is an angle with respect to an axis Z perpendicular to the upper surface of the ferromagnetic layer 23 or the upper surface of the cap layer 24.

By using the large incident angle θ1 as the ion beam angle as above, the magnetoresistive element MTJ can be patterned without a re-deposition on the sidewalls of the tunnel barrier layer 22 as shown in FIG. 7. Furthermore, using the large incident angle θ1 as the ion beam angle, the magnetoresistive element MTJ can be patterned with higher etching selectivity as compared to a case where the patterning is performed using the ion beam angle near θ1.

Furthermore, by setting the acceleration voltage of the ion beam to the low acceleration voltage V1, the magnetoresistive effect element MTJ can be patterned without any damage to the ferromagnetic layers 21 and 23 even when the ion beam angle is at the large incident angle θ1.

speed for improved throughput, the range should preferably be set in the range between 40° and 60° inclusive.

Now, a second etching process is performed.

The second etching process is, as can be understood from Table 1, performed for the purpose of removing the etching residue at the tail portion formed in the first etching process. More specifically, the second etching process is performed for the purpose of removing the etching residue without a re-deposition on the sidewalls of the tunnel barrier layer and any damage to the ferromagnetic layers 21 and 23 while keeping the high etching selectivity used in the first etching process of the field portion of the MTJ.

Therefore, the IBE in the second etching process is performed with acceleration voltage V2 which is greater than the acceleration voltage in the first etching process, and an incident angle θ2 which is less than the ion beam angle in the first etching process. The acceleration voltage 2 may be a high acceleration voltage of 1 keV or greater. Furthermore, the ion beam angle θ2 may be a small incident angle which is set, for example, in the range between 0° and 30° inclusive.

Figure 8:
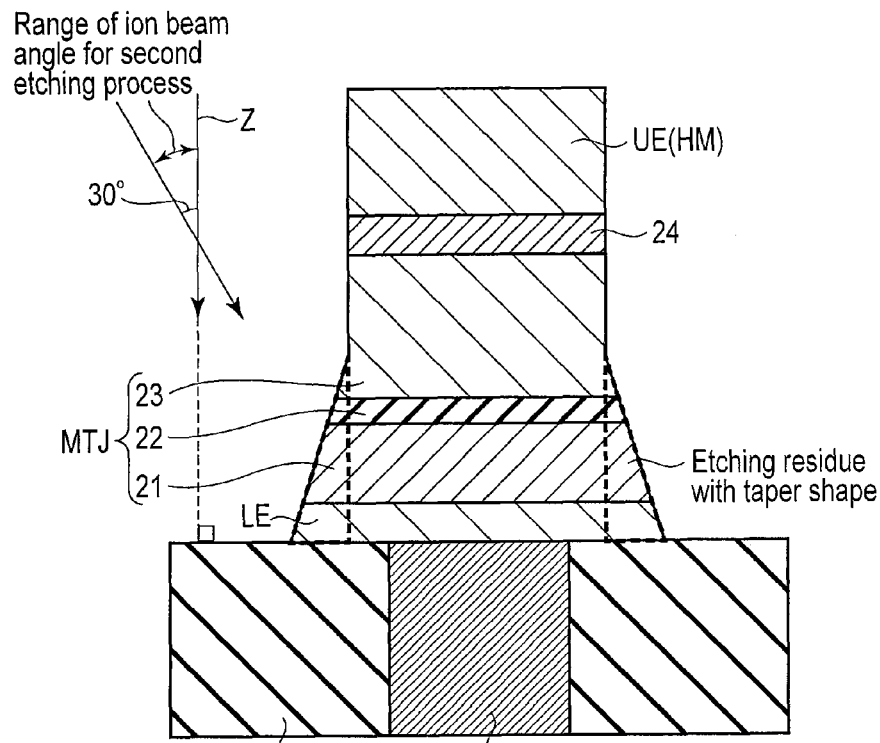

Here, as shown in FIG. 8, the ion beam angle refers to an angle with respect to the axis Z as in FIG. 6. Furthermore, the tail portion is defined as a portion of the laminated structure including the lower electrode LE, ferromagnetic layers 21 and 23, tunnel barrier layer 22, and cap layer 24, the portion whose sidewall angle is less than 80° with respect to the upper surface of the interlayer insulating layer 16.

That is, in the above-described first etching process, the sidewalls of the upper portion of the magnetoresistive element MTJ are patterned to be 80° or greater and 90° or less with respect to the upper surface of the interlayer insulating layer 16. At that time, the sidewalls of the lower portion of the magnetoresistive element MTJ are less than 80° with respect to the upper surface of the interlayer insulating layer 16. This portion is referred to as the tail portion (etching residue).

The etching residue of the tail portion influences the MR ratio of the magnetoresistive element MTJ. For example, when the ferromagnetic layer 21 is a storage layer and the ferromagnetic layer 23 is a reference layer, and the size of the storage layer is greater than that of the reference layer, the magnetization near the sidewalls of the storage layer becomes unstable and the MR ratio of the magnetoresistive element MTJ varies. Considering this point, the size of the storage layer should preferably be as close to that of the reference layer as possible, or should preferably be less than or equal to that of the reference layer.

Therefore, the etching residue at the tail portion must be removed.

In the second etching process, using the small incident angle θ2 as the ion beam angle as shown in FIG. 9, the etching residue can be removed from the tail portion without any damage to the ferromagnetic layers 21 and 23 even when the acceleration voltage of the ion beam is the high acceleration voltage V2.

That is, the ion beam having the small incident angle θ2 does not enter the sidewalls of the magnetoresistive element MTJ and does not cause any damage to the magnetoresistive element MTJ. Furthermore, even when the ion beam in the IBE has the small incident angle θ2, because of the tapered shape of the etching residue at the tail portion, the incident angle with respect to the surface thereof becomes large. Therefore, even when the high acceleration voltage V2 is used in the IBE, the etching residue at the tail portion can be removed with high etching selectivity.

On the other hand, the ion beam having the small incident angle θ2 enters a flat upper surface of a layer such as the interlayer insulating layer 16 or the upper electrode UE at approximately perpendicular angle, and thus, an etching effect hardly occurs but an ion implantation effect actively occurs instead.

Therefore, through the IBE in the second etching process, the impurity regions 18a and 18b containing one of the elements such as Ne, Ar, Kr, Xe, N, and O used for the ion beam of the IBE are formed in the layer having the flat upper surface such as the interlayer insulating layer 16 and the upper electrode UE.

Furthermore, since the ion beam in the second etching process produces the ion implantation effect actively with respect to the layer having the flat upper surface such as the interlayer insulating layer 16 and the upper electrode UE, a re-deposition to the sidewalls of the tunnel barrier layer 22 does not occur from such a layer.

Here, similarly to the first etching process, the ion beam angle of the IBE influences the etching rate of the etching residue at the tail portion.

Therefore, during the second etching process, that is, during the irradiation of the ion beam, the ion beam angle may be varied in order to make the etching rate of the etching residue large. For example, by gradually decreasing the ion beam angle, the etching residue at the tail portion of the magnetoresistive element MTJ can be removed completely. In addition, the ion beam angle can be set constant during the irradiation of the ion beam.

Note that the ion beam angle in the second etching process should be, as described above, in a range between 0° or more and less than 30°. However, considering good etching selectivity and good removal of the etching residue, the range should preferably be set in the range between 0° and 10° inclusive.

As above, the performance of the first and second etching processes, the shape of the magnetoresistive element MTJ can be more ideal.

Note that, as described above, the second etching process is performed in order to remove the etching residue at the tail portion of the magnetoresistive element MTJ formed in the first etching process, and thus, the first etching process should preferably be performed while the sidewalls of the tunnel barrier layer 22 are included in the tail portion as shown in FIG. 7.

In that case, a re-deposition adhered on the sidewalls of the tunnel barrier layer (tail portion) 22 during the first etching process is removed when the etching residue at the tail portion of the magnetoresistive element is removed in the second etching process. Consequently, after the first and second etching processes, there is not a re-deposition which would cause electrically short failure on the sidewalls of the tunnel barrier layer 22.

Then, as shown in FIG. 10, the protective layer PL is formed on the interlayer insulating layer 16 to cover the magnetoresistive element MTJ. The protective layer PL should preferably be of oxygen-shielding in order to prevent the magnetoresistive element MTJ from oxidization, and the protective layer PL should preferably contain a nitride such as SiN, AlN, and HfN. The protective layer PL may be formed by, for example, CVD method, Cyclic-CVD method, or ALD method performed at a temperature below 300° C.

Furthermore, the interlayer insulating layer 17 is formed on the protective layer PL.

Figure 11:
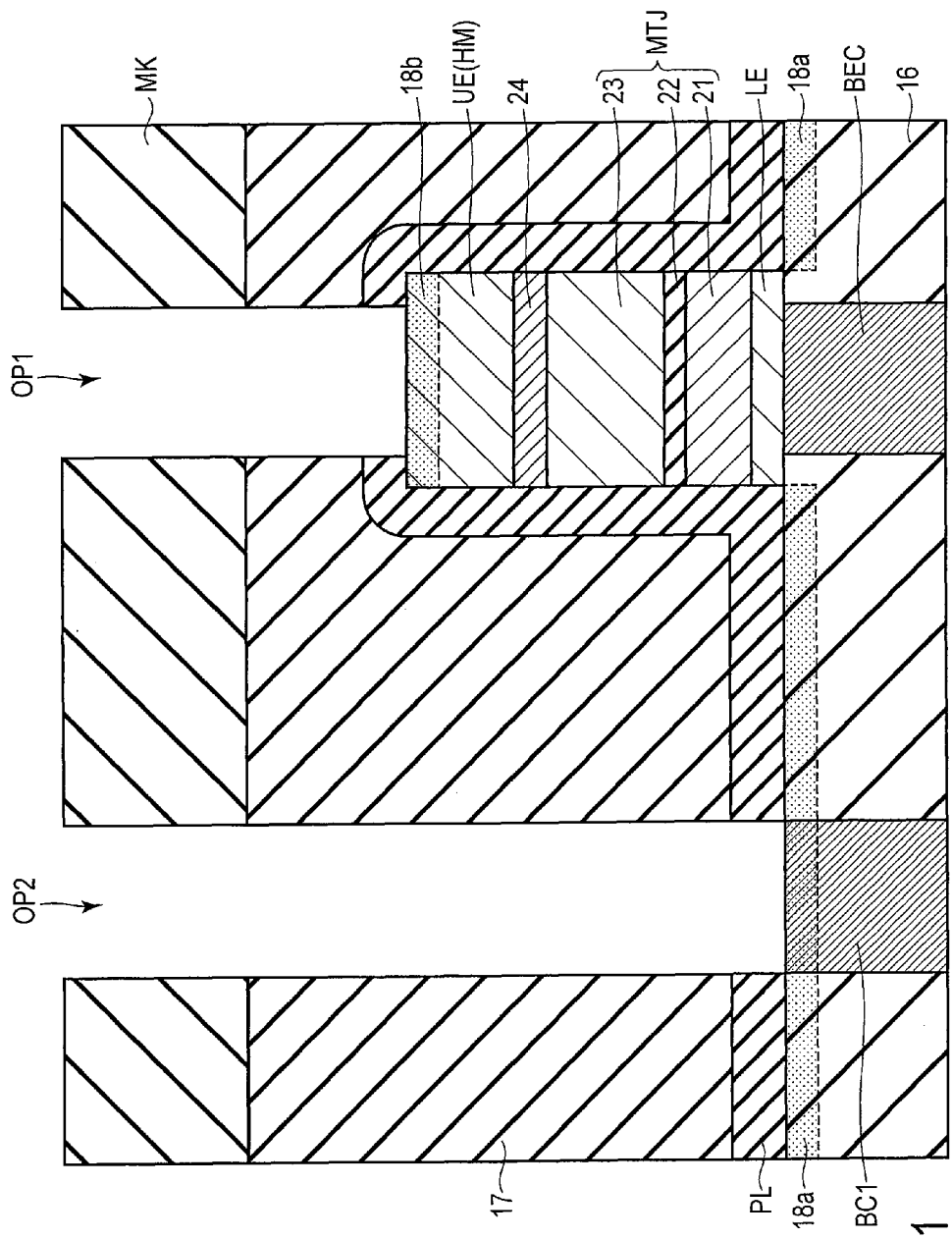

Now, as shown in FIG. 11, using a mask layer (for example, resist layer) MK as a mask, contact holes OP1 and OP2 passing through the interlayer insulating layer 17 and the protective layer PL by reactive ion etching (RIE).

Lastly, as shown in FIG. 12, in the interlayer insulating layer 17, the contact plug BC2 is formed to be connected to the impurity region 18a in the contact plug BC1, and the contact plug TEC is formed to be connected to the impurity region 18b in the upper electrode UE.

Furthermore, on the interlayer insulating layer 17, bit line BL1 is formed to be connected to the contact plug TEC and bit line BL2 (SL) is formed to be connected to the contact plug BC2.

By the above manufacturing method, the magnetic memory including the magnetoresistive element shown in FIG. 5 is manufactured.

4. Present Embodiment and Comparative Example

Figure 13:
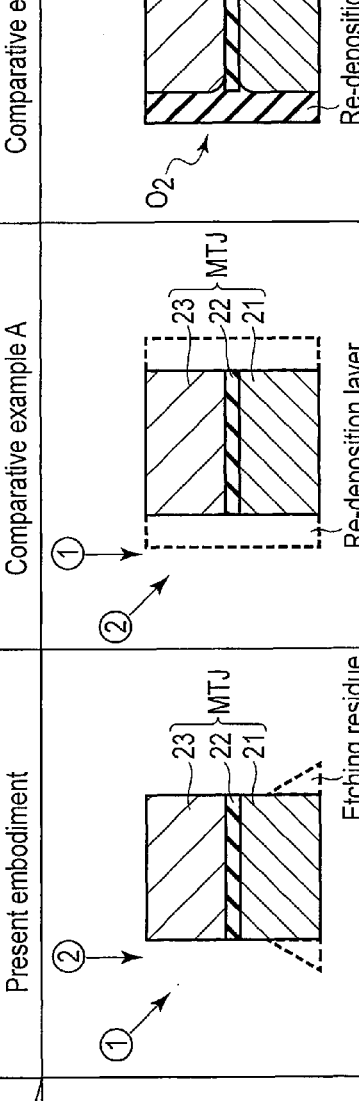
FIG. 13 is a view in which the present embodiment is compared to comparative examples.

FIG. 13 is a view in which the present embodiment is compared to comparative examples.

In the present embodiment, the first etching process is performed by IBE with a low acceleration voltage and large incident angle; and then the second etching process is performed by IBE with a high acceleration voltage and small incident angle.

In that case, the magnetoresistive element can be patterned without a re-deposition to the tunnel barrier layer and damage to the magnetoresistive element. This is evident from the above. Furthermore, by optimally adjusting the ion beam angle in the first and second etching processes, high etching selectivity can be achieved.

In contrast, in comparative example A, a first etching process is performed by IBE with a low acceleration voltage and small incident angle. In the first etching process, a magnetoresistive element can be etched almost in an ideal shape; however, a re-deposition is formed on the sidewalls of the tunnel barrier layer 22.

Thus, in the comparative example A, a second etching process is performed after the first etching process performed by the IBE with a low acceleration voltage and large incident angle. Because the second etching process is performed to remove the re-deposition, a large incident angle is employed. However, to avoid damage to the magnetoresistive element, the second etching process must be performed with a low acceleration voltage.

Therefore, in the comparative example A, the removal of the re-deposition may be insufficient and an electrically short failure may occur.

In comparative example B, a magnetoresistive element is patterned by only one etching process, that is, by IBE with a low acceleration voltage and small incident angle. A re-deposition formed in this etching process is insulated by oxidization.

However, if this oxidization of the re-deposition is performed insufficiently, an electrically short failure may occur in the comparative example B. Furthermore, during the oxidization of the re-deposition, edge portions of the ferromagnetic layers 21 and 23 those contact the tunnel barrier layer 22 are oxidized and thereby, degradation in the MR ratio may occur.

Therefore, comparing the present embodiment to the comparative examples A and B, the present embodiment can form a magnetoresistive element in an ideal shape without degrading its characteristics, and this is an advantage of the present embodiment.

5. Application Example

Figure 18:
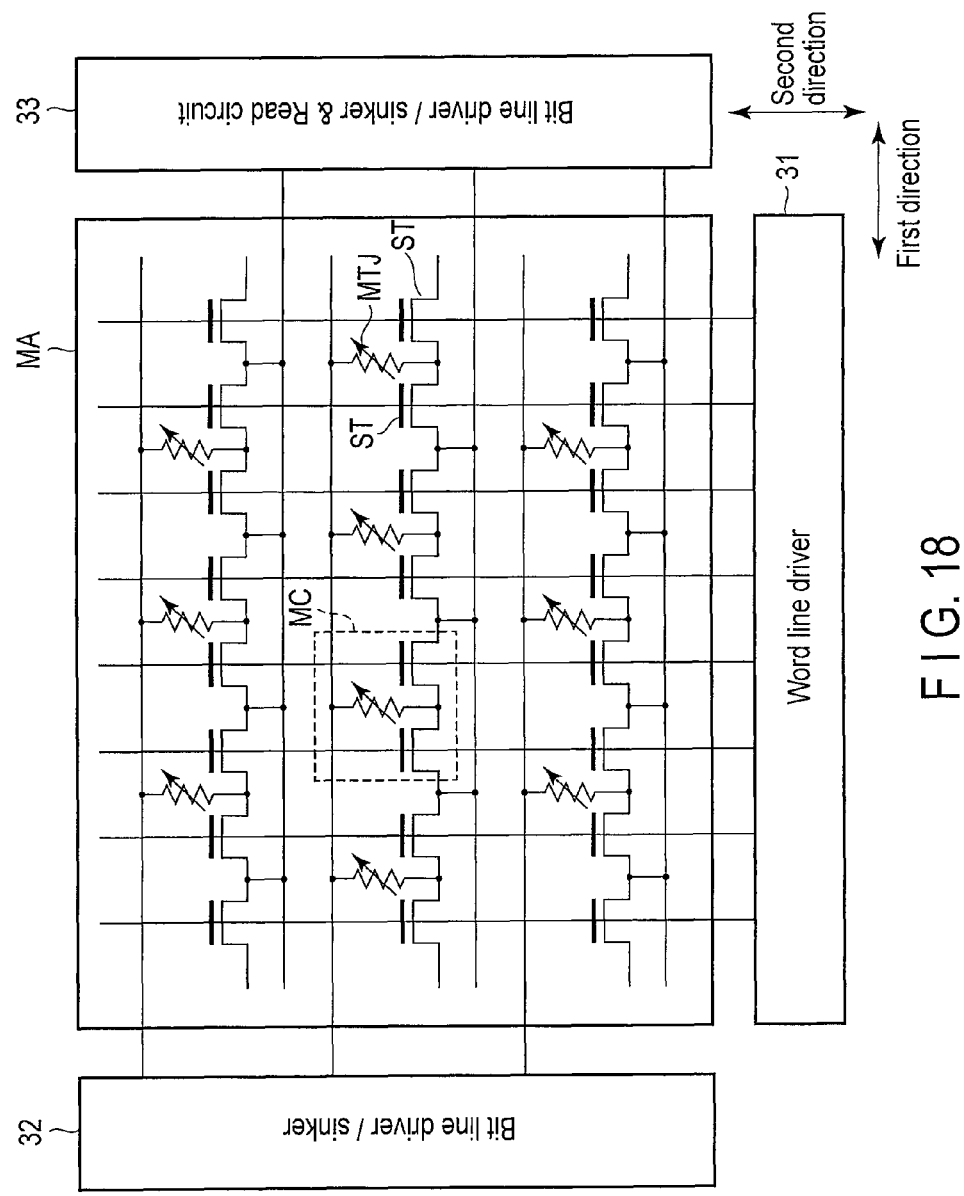
FIG. 18 is a circuit diagram of an equivalent circuit of the magnetic memory of FIGS. 14 to 17.

FIGS. 14 to 18 show an example of memory cell array area of a magnetic random access memory. FIG. 14 is a plane view of the memory cell array area, FIG. 15 is a cross-sectional view taken along line XV-XV in FIG. 14, FIG. 16 is a cross-sectional view taken along line XVI-XVI in FIG. 14, and FIG. 17 is a cross-sectional view taken along line XVII-XVII in FIG. 14. FIG. 18 is an equivalent circuit of the memory cell array area shown in FIGS. 14 to 17.

In the description related to FIGS. 14 to 18, elements those have been referred to in the description related to FIGS. 1 to 13 are referred to the same.

Here, explained is a case where one memory cell MC in the memory cell array area MA includes two selection transistors ST and one magnetoresistive element MTJ, in other words, a two-transistor, one-element memory cell. However, this does not mean that the present embodiment is applied to this type alone. That is, the present embodiment may be applied to other types of memory cell array area MA such as a one-transistor, one-element type and a cross-point type.

A plurality of memory cells MC are arranged in an array on the semiconductor substrate 11. Each memory cell MC includes two selection transistors ST on the semiconductor substrate 11 and one magnetoresistive element MTJ connected to both of these two selection transistors ST.

Each selection transistor ST includes source/drain diffusion layers 13a and 13b in the semiconductor substrate 11 and a word line WL as a gate electrode on a channel between source/drain diffusion layers 13a and 13b. The word line WL extends in a second direction and is connected to a word line driver 31.

The magnetoresistive effect element MTJ is disposed on source/drain diffusion layer 13a and is connected to source/drain diffusion layer 13b. Furthermore, bit line BL1 is disposed on the magnetoresistive element MTJ and is connected thereto. Bit line BL1 extends in a first direction and is connected to a bit line driver/sinker 32.

Bit line BL2 is disposed on source/drain diffusion layer 13b and is connected to source/drain diffusion layer 13b. In reading, bit line BL2 functions as, for example, a source line SL connected to a sense amplifier. Bit line BL2 extends in the first direction and is connected to a bit line driver/sinker and read circuit 33.

The impurity region 18a is provided in the interlayer insulating layer 16.

The layout of the memory cell array area described here is merely an example, and any arbitrary modification is adoptable. For example, when the memory cell array area MA is viewed from the above of the semiconductor substrate 11, source/drain diffusion layers 13a and 13b, magnetoresistive element MTJ, and bit line BL1 are shifted from one another in the second direction from a positional relationship standpoint; however, determination of shift or not shift, and determination of how far they are shifted are arbitrarily changeable.

Furthermore, in the present embodiment, bit lines BL1 and BL2 are formed in different wiring layers but may be formed in the same wiring layer.

6. Manufacturing Equipment

The first and second etching processes of the present embodiment are performable by an ion beam apparatus which produces the ion beam. For example, an ion beam etching (IBE) apparatus and an ion implantation apparatus are typical ion beam apparatuses.

Generally, an ion beam apparatus includes an ion generator, ion accelerator, and etching processing part. The ion generator produces, for example, ions such as Ne, Ar, Kr, Xe, N, and O. The ion accelerator accelerates the ions produced by the ion generator toward the etching processing part. The etching processing part includes, for example, a stage on which a wafer is mounted. The stage should preferably be able to rotate, revolve, move in parallel, and tilt (incline) to perform the first and second etching processes of the present embodiment.

FIG. 19 shows a first example of a manufacturing apparatus.

A manufacturing apparatus 21 of the present embodiment is a cluster tool manufacturing apparatus.

The manufacturing apparatus 21 includes a multi-chamber, that is, a first chamber C1 and a second chamber C2, and is controlled by a controller 20.

The first chamber C1 performs the first etching process of the present embodiment. The first etching process should preferably be performed by rotating the stage consecutively, changing the tilt periodically, swinging the ion beam angle within a predetermined range, or combining these operations optionally. The rate of rotation of the stage should preferably be 60 rpm or more. The tilt should preferably be set to change the ion beam angle within the range of −90° to +90°.

The second chamber C2 performs the second etching process of the present embodiment. As performed in the first etching process, the second etching process should preferably be performed by rotating the stage consecutively, changing the tilt periodically, swinging the ion beam angle within a predetermined range, or combining these operations optionally. The rate of rotation of the stage should preferably be 60 rpm or more. The tilt should preferably be set to change the ion beam angle within the range of −30° to +30°. When the ion beam angle in the second etching process is 0°, a tilt mechanism in the stage of the second chamber C2 may be omitted.

The transfer of the wafer in the first and second chambers C1 and C2 should preferably be performed in a vacuum or at low pressure. This is to prevent oxidization of the magnetoresistive element during the transfer of the wafer.

In this manufacturing apparatus, the first and second etching processes are performed in the different chambers. Thus, the first chamber C1 can be developed to specifically suit to, for example, the ion beam angle and acceleration voltage used in the first etching process. Furthermore, the second chamber C2 can be developed to specifically suit to, for example, the ion beam angle and acceleration voltage used in the second etching process.

FIG. 20 shows a second example of a manufacturing apparatus.

The second example has its feature in integrating the first and second chambers C1 and C2 of the first example (in FIG. 19) into one chamber. That is, a chamber CX shown in FIG. 20 performs the first and second etching processes of the present embodiment.

The other points are the same as in the first example, and thus, detailed description is omitted.

FIG. 21 shows a third example of a manufacturing apparatus.

The third example has its feature in a third chamber C3 added to the first and second chambers C1 and C2 in the first example (in FIG. 19).

As described in the above manufacturing method section, a protective layer which covers the magnetoresistive element is formed after the patterning of the magnetoresistive element by the first and second etching processes in the present embodiment. The protective layer is formed to prevent the oxidization of the magnetoresistive element even if the wafer is taken out of the chamber and is exposed to the atmosphere.

Considering this point, as long as the magnetoresistive element is not covered with the protective layer, the wafer must be prevented from exposing to the atmosphere. Here, as already mentioned above, the protective layer contains a nitride and is formed by, for example, a CVD apparatus.

For this reason, in the third example, the first chamber C1 which performs the first etching process (IBE), the second chamber which performs the second etching process (IBE and ion implantation), and the third chamber C3 which performs the CVD process are provided in the manufacturing apparatus 21. Thus, the transfer of the wafer between the first, second, and third chambers C1, C2, and C3 is performed in a vacuum or at low pressure.

That is, the manufacturing apparatus 21 of the third example is a cluster tool manufacturing apparatus including the first, second, and third chambers C1, C2, and C3.

The other points are the same as in the first example, and thus, detailed description is omitted.

Note that the angle of divergence of the ion beam should desirably be as small as possible in each of the manufacturing apparatuses (in FIGS. 19 to 21) described above. That is because, when the tilt increases, the influence of the angle of divergence of the ion beam varies depending on the position on the wafer. Specifically, when the tilt increases, the shape of the magnetoresistive element on the edge portion of the wafer shifts significantly from the shape of the magnetoresistive element (for example, a circular shape) at the center portion of the wafer.

Therefore, to suppress variations in the magnetic memory characteristics caused by this shift, the angle of divergence of the ion beam should preferably be as small as possible, or namely be 4° or less. Furthermore, considering a case where a 300 mm wafer is used, a change in the shape of the magnetoresistive element due to the angle of divergence of the ion beam can be practically ignored if the angle of divergence is set to 2° or less.

7. Conclusion

As can be understood from the above, in the present embodiment, an electrically short failure between the magnetoresistive element and the reference layer can be prevented without causing any damage to the magnetoresistive element.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetic memory comprising:
a semiconductor substrate;
a transistor having a first diffusion layer and a second diffusion layer in the semiconductor substrate and a gate electrode between the first and second diffusion layers;
a first insulating layer on the semiconductor substrate, the first insulating layer covering the transistor;
a first contact plug in the first insulating layer, the first contact plug being connected to the first diffusion layer;
a second contact plug in the first insulating layer, the second contact plug being connected to the second diffusion layer;
a magnetoresistive element on the first insulating layer, the magnetoresistive element being connected to the first contact plug;
an electrode on the magnetoresistive element;
a first impurity region in the first insulating layer and the second contact plug;
a second impurity region in the electrode;
a second insulating layer on the first insulating layer, the second insulating layer covering the magnetoresistive element and the electrode;
a third contact plug in the second insulating layer, the third contact plug being connected to the electrode;
a fourth contact plug in the second insulating layer, the fourth contact plug being connected to the second contact plug;
a first conductive line on the second insulating layer, the first conductive line being connected to the third contact plug; and
a second conductive line on the second insulating layer, the second conductive line being connected to the fourth contact plug.

2. The memory of claim 1,
wherein the first and second impurity regions include one of Ne, Ar, Kr, Xe, N, and O.

3. The memory of claim 1,
wherein the second impurity region is provided in an upper portion of the electrode.

4. The memory of claim 3,
wherein the second impurity region has a thickness of 1 nm or more from an upper surface of the first insulating layer, and has a thickness less than a thickness of the electrode.

5. The memory of claim 1,
wherein the magnetoresistive element is smaller than the first contact plug in a direction parallel to a surface of the semiconductor substrate.

* * * * *